United States Patent
Dunayer

(10) Patent No.: US 8,878,705 B1
(45) Date of Patent: Nov. 4, 2014

(54) VARIABLE BIT-LENGTH REITERATIVE LOSSLESS COMPRESSION SYSTEM AND METHOD

(71) Applicant: Npression Technologies, LLC, Dallas, TX (US)

(72) Inventor: Sidney Dunayer, Pine Bush, NY (US)

(73) Assignee: Npression Technologies, LLC, Dallas, TX (US)

( * ) Notice: Subject to any disclaimer, the term of this patent is extended or adjusted under 35 U.S.C. 154(b) by 0 days.

(21) Appl. No.: 14/229,515

(22) Filed: Mar. 28, 2014

(51) Int. Cl.
*H03M 7/40* (2006.01)

(52) U.S. Cl.
CPC ............................ *H03M 7/40* (2013.01)
USPC ................................. 341/87; 341/50; 341/51

(58) Field of Classification Search
CPC ................................. H03M 7/30; H04B 1/662
USPC ................................................. 341/50, 51, 87
See application file for complete search history.

(56) References Cited

U.S. PATENT DOCUMENTS

| | | | |
|---|---|---|---|
| 5,384,846 A * | 1/1995 | Berson et al. ................. | 713/186 |
| 5,600,726 A | 2/1997 | Morgan et al. ................. | 380/49 |
| 5,893,084 A | 4/1999 | Morgan et al. ................. | 706/50 |
| 6,278,913 B1 * | 8/2001 | Jiang ................................. | 701/3 |
| 6,661,839 B1 * | 12/2003 | Ishida et al. .................... | 375/240 |
| 6,741,368 B1 * | 5/2004 | Hoel ............................... | 358/1.9 |
| 7,111,094 B1 | 9/2006 | Liu et al. ......................... | 710/65 |
| 7,925,639 B2 * | 4/2011 | Vo et al. ......................... | 707/693 |
| 2004/0049598 A1 | 3/2004 | Tucker et al. .................. | 709/246 |
| 2005/0055367 A1 * | 3/2005 | Vo et al. ......................... | 707/102 |
| 2008/0071748 A1 * | 3/2008 | Wroblewski et al. ............. | 707/3 |
| 2011/0161776 A1 * | 6/2011 | Liu et al. ........................ | 714/755 |
| 2012/0039384 A1 * | 2/2012 | Reznik ........................ | 375/240.2 |
| 2012/0265738 A1 * | 10/2012 | Beckmann et al. ........... | 707/693 |

OTHER PUBLICATIONS

Bose, Ranjan "A Novel Compression and Encryption Scheme Using Variable Model Arithmetic Coding and Coupled Chaotic System," *IEEE Transactions on Circuits and Systems*, 1: Regular Papers, vol. 53, No. 4, Apr. 2006, pp. 848-857.

* cited by examiner

*Primary Examiner* — Jean B Jeanglaude
(74) *Attorney, Agent, or Firm* — Sunstein Kann Murphy & Timbers LLP

(57) ABSTRACT

A computer-implemented method of performing lossless compression of a digital data set uses an iterative compression process in which the number of symbols N and bit length per symbol n may vary on successive iterations. The process includes analyzing at least a part of the data set to establish a partition thereof into N symbols of symbol length n, and to determine whether the N symbols can be further compressed, and, if so, a model to be used in encoding the N symbols.

12 Claims, 7 Drawing Sheets

VARIABLE BIT-LENGTH REITERATIVE LOSSLESS COMPRESSION SYSTEM AND METHOD

TECHNICAL FIELD

The present invention relates to compression of digital data, and more particularly to variable bit-length reiterative lossless compression.

BACKGROUND ART

Information theory teaches that entropy is a measure of the disorder of a system and is directly related to the amount of information contained within that system. A low entropy system is highly ordered and can usually be represented in fewer bits of information than a disordered, high entropy system. Information theory further teaches that the entropy of a binary symbol, i.e. the number of bits required to express that symbol, is the negative base-2 logarithm of the probability of the symbol's occurrence:

$$H = -\log_2(FREQ/CUMFREQ)$$

where H is the entropy, FREQ is the frequency of occurrence of the symbol so far and CUMFREQ is the cumulative frequency of all symbols seen so far. Furthermore, the total entropy of a data set of binary symbols is the sum of the entropies of the individual symbols:

$$H(p) = \sum_i H_i$$

where H(p) is the total entropy of the data set and $H_i$ is the entropy of the i-th symbol in the data set.

Most methods of lossless data compression are based on an encoding technique in which repetitive symbols or symbol patterns within a data set are identified and then replaced with symbols that occupy, on average, less space than the original symbols or symbol patterns.

Examples of lossless data compression techniques include Run Length Encoding, Huffman Coding, Arithmetic Coding and Dictionary-Based Compression. Several of these methods utilize one or more probability tables to represent the frequency distributions of the various symbols or symbol patterns. For example, an Order-0 Adaptive Model for an alphabet of n symbols begins with each symbol having a frequency of 1 and a cumulative frequency of n. This gives each symbol a probability of 1/n. As a symbol is seen in the input data set, the frequency of that symbol is increased by 1 and hence the cumulative frequency is also increased by 1. This increases the probability that the symbol will occur and lowers the entropy of that symbol.

To show the behavior of this particular model in practice, suppose we have an alphabet of 8-bit symbols drawn from the set [A, B, C, D, E, F] and we wish to encode a data set that contains the characters ABCDAAFEFDA. The table below shows the entropy calculations for each step:

TABLE 1

| Symbol | Freq(A) | Freq(B) | Freq(C) | Freq(D) | Freq(E) | Freq(F) | CumFreq | Entropy |
|---|---|---|---|---|---|---|---|---|
| (Init) | 1 | 1 | 1 | 1 | 1 | 1 | 6 | |
| A | 1 | 1 | 1 | 1 | 1 | 1 | 6 | 2.58 |
| B | 2 | 1 | 1 | 1 | 1 | 1 | 7 | 2.80 |
| C | 2 | 2 | 1 | 1 | 1 | 1 | 8 | 3.00 |
| D | 2 | 2 | 2 | 1 | 1 | 1 | 9 | 3.17 |
| A | 2 | 2 | 2 | 2 | 1 | 1 | 10 | 2.32 |
| A | 3 | 2 | 2 | 2 | 1 | 1 | 11 | 1.87 |
| F | 4 | 2 | 2 | 2 | 1 | 1 | 12 | 3.58 |
| E | 4 | 2 | 2 | 2 | 1 | 2 | 13 | 3.70 |
| F | 4 | 2 | 2 | 2 | 2 | 2 | 14 | 2.81 |
| D | 4 | 2 | 2 | 2 | 2 | 3 | 15 | 2.90 |
| A | 4 | 2 | 2 | 3 | 2 | 3 | 16 | 2.00 |
| (end) | 5 | 2 | 2 | 3 | 2 | 3 | 17 | |

The original data set contained 11 8-bit symbols or 88 bits and the compressed data set encoded using an Order-0 Adaptive Model is expected to contain around 31 bits.

Based upon the frequency distribution of the original input data set, different models and encoding techniques provide different levels of compression. If we understand the nature of the data beforehand, we can better choose an appropriate model and encoding technique to use.

Each of the encoding methods relies on the substitution of a smaller binary string for a larger binary string based on the frequency of symbols or symbol patterns within the uncompressed data. The desired result of this process is a data set that is smaller than the original.

To achieve compression, an uneven frequency distribution of symbols or symbol patterns must be present in the uncompressed data set. Greater unevenness of the frequency distribution in the original data set allows us to achieve greater compression.

All known methods of lossless data compression result in a more even frequency distribution of the symbols in the compressed data set. Since lossless data compression methods rely upon an uneven frequency distribution of symbols or symbol patterns, the even frequency distribution makes further compression near impossible.

Most known compression techniques and the current state of the art focus on achieving the maximum possible compression in the minimum amount of time in order to accommodate real time applications. This, by its very nature, dictates that only one pass across the data set can occur.

It is known in the prior art to use a rules-based virtual machine for variable bit-length processing, and it has been speculated that variable bit-length processes might be used in achieving compression. See U.S. Pat. Nos. 5,600,726 and 5,893,084. Although these patents mention a number of lossless compression methods that could possibly be adapted to use an n-bit symbol, they fail to disclose a method for determining an optimal value for "n". While U.S. Pat. No. 7,111,094, to Liu et al., appears to disclose a strategy for calculating an optimal value for "n", for each one of a series of blocks to be compressed, the approach of the Lieu patent is to transform the data to be compressed in an attempt to change its frequency distribution. However, the Liu patent fails to specify how to determine the length of a block, and fails to specify a particular compression model to be used for the compression.

SUMMARY OF THE EMBODIMENTS

Embodiments of the current invention for performing variable bit-length lossless compression may employ many passes to achieve a desired or maximum compression. Thus, embodiments of the present invention may sacrifice speed for a reduction in data size. Embodiments of the invention are directed to applications that require minimum size for storage. Possible applications for embodiments of the current invention include, but are in no way limited to, medical imaging and streaming media.

In a first embodiment of the invention there is provided a computer-implemented method of performing lossless compression of a digital data set. In this embodiment, the method includes performing a compression process including:
analyzing at least a part of the data set to establish a partition thereof into N symbols of symbol length n, and to determine whether the N symbols can be further compressed, and, if so, a model to be used in encoding the N symbols;
if it has been determined that the N symbols can be further compressed, encoding the N symbols using the model and storing the encoded data in an iteration store;
if it has been determined that the N symbols cannot be compressed, storing the N symbols in the iteration store;
determining whether any part of the digital data set remains to be processed, and if so, then repeating the compression process for an additional part of the digital data set; and if not, then substituting the contents of the iteration store for the data set and repeating the compression process on the data set thus updated until a specified end condition has been met, and then providing an output from the iteration store.

In another embodiment, there is provided a computer-implemented method of analyzing a digital data set to establish a partition thereof into N symbols of symbol length n, and to determine whether the N symbols can be further compressed, and, if so, a model to be used in encoding the N symbols. In this embodiment, the method includes:
storing for later retrieval a set of values for a natural number n that is greater than 0;
performing an analysis loop process including:
retrieving a distinct one of the stored values for n,
for each symbol of length n in the data set, performing an entropy calculation including:
receiving such symbol from the digital data set at an input;
for each model in a set of models,
computing an entropy value and adding the computed entropy value to an entropy accumulator for such model; and
using the value in the entropy accumulator, computing, for such symbol, a compression score and an updated value of partition size N for such model;
using the values in the entropy accumulators for each of the models, identifying the model having the best compression score; and storing the identified model, its corresponding value of N, and its compression score;
determining whether a processing end point has been reached, and if not, then
repeating the analysis loop process for an additional value of n; otherwise
evaluating the stored compression scores for each value of n to identify the value of n having the best compression score; and returning the identified value of n, and its corresponding model and its corresponding value of N.

a computer-implemented method of analyzing a digital data set to establish a partition thereof into N symbols of symbol length n, and to determine whether the N symbols can be further compressed, and, if so, a model to be used in encoding the N symbols. In this embodiment, the method includes:
storing for later retrieval a set of values for a natural number n that is greater than 0;
performing an analysis loop process including:
retrieving a distinct value for n;
for each symbol of length n in the data set, performing an entropy calculation including:
receiving such symbol from the digital data set at an input;
for each model in a set of models,
computing an entropy value and adding the computed entropy value to an entropy accumulator for such model; and
using the value in the entropy accumulator, computing for such symbol, a compression score and an updated value of partition size N for such model;
using the values in the entropy accumulators for each of the models, and identifying the model having the best compression score; and storing the identified model, its corresponding value of N, and its compression score;
evaluating the stored compression scores for each value of n to identify the value of n having the best compression score; and
returning the identified value of n, and its corresponding model and its corresponding value of N.

In a further related embodiment, a first analysis loop process is performed for a first distinct value of n in parallel with performing a second analysis loop process for a second distinct value of n. In a further related embodiment, the stored set of values for n are stored in a FIFO and the retrieved distinct values of n are retrieved from the FIFO. In a further related embodiment, the processing end point is completion of processing for all values of n. In a further related embodiment, the processing end point is when the compression score for at least one value of n and using at least one model is deemed sufficient.

In another embodiment of the invention, there is provided a computer-implemented method of analyzing a digital data set to establish a partition thereof into N symbols of symbol length n, and to determine whether the N symbols can be further compressed, and, if so, a model to be used in encoding the N symbols. The method of this embodiment includes:
in a parallel processing procedure, for each of a plurality of analysis loops, assigning a distinct value of n, wherein the value of n is selected from a set of natural numbers having a value greater than 0, and using a FIFO to communicate to each of the analysis loops its assigned value of n;

in each analysis loop:
for each symbol of length n in the data set, performing an entropy calculation including:
receiving such symbol from the digital data set at an input;
for each model in a set of models,
computing an entropy value and adding the computed entropy value to an entropy accumulator for such model; and
using the value in the entropy accumulator, computing for such symbol, a compression score and an updated value of partition size N for such model;
using the values in the entropy accumulators for each of the models, and identifying the model having the best compression score; and storing the identified model, its corresponding value of N, and its compression score;
determining whether a processing end point has been reached, and if not, then repeating the parallel processing procedure; otherwise
evaluating the stored compression scores for each value of n to identify the value of n having the best compression score; and returning the identified value of n, and its corresponding model and its corresponding value of N.

In another embodiment, the invention provides a computer-implemented method of performing lossless compression of a digital data set. In this embodiment, the method includes:
performing an analysis process including:
analyzing at least a part of the data set to establish a partition thereof into N symbols of symbol length n, and to determine whether the N symbols can be further compressed, and, if so, a model to be used in encoding the N symbols;
storing, in an analysis FIFO, a set of values of n, N, and the model for the just-analyzed portion of the digital data set;
determining whether any part of the digital data set remains to be processed, and if so, then repeating the analysis process for an additional part of the digital data set;
for each set of values in the analysis FIFIO, performing an encoding process including:
retrieving, from the analysis FIFO, such set of values of n, N, and the model;
if it has been determined that the N symbols can be further compressed, encoding the N symbols using the retrieved model and retrieved value of n and storing the compressed data in an iteration store;
if it has been determined that the N symbols cannot be compressed, storing the N symbols in the iteration store;
substituting the contents of the iteration store for the data set and repeating the analysis process and the compression process on the data set thus updated until a specified end condition has been met, and then providing an output from the iteration store.

In a related embodiment, the analyzing process and the compression process operate in parallel at least some of the time.

In yet another embodiment, there is provided a non-volatile storage medium in which is stored a compressed digital data set. In this embodiment, the compressed data set includes:
a sentinel indicating whether or not the results of decompressing said compressed digital data set results in an endpoint condition;
a set of partitions, wherein at least one of the partitions includes compressed digital data, and each partition includes:
a partition header, the header including:
a type field indicating whether the partition contains compressed or uncompressed data;
a sentinel indicating whether the partition is the last partition in the compressed digital data set;
if the type field indicates that the partition contains uncompressed data, a length field indicating the number of bits of uncompressed data in the partition;
if the type field indicates that the partition contains compressed data, a symbol field containing a value of little-n in the partition, a model field containing a value identifying the model used in the partition, and if the last partition, a discard field indicating a number of bits in the last decompressed symbol from the partition that must be discarded; and
data of the partition, such data having content and format characterized by the partition header.

In another embodiment, the invention provides a computer-implemented method for decompressing a digital data set compressed using a variable bit-length reiterative lossless compression method, the compressed digital data set including a set of partitions.
The method of this embodiment includes:
performing a decompression process including:
for each partition in the compressed digital data set,
examining a partition header for the partition to determine if its data is compressed or uncompressed and if the partition is the last partition;
if the partition's data is determined to be compressed,
retrieving from the partition header a value of little-n for the partition and a value identifying the model;
if the partition is determined to be the last partition, retrieving from the header a number of bits in the last decompressed symbol from the partition that must be discarded;
decoding the partition data using the model identified for the partition and the value of little-n for the partition and storing the decoded partition data in a decompression store;
if the partition's data is determined to be uncompressed,
retrieving from the partition header a value indicating the number of bits of uncompressed data in the partition;
using the value indicating the number of bits of uncompressed data in the partition, copying the partition's data to the decompression store;
if an endpoint condition has not been reached, then substituting the contents of the decompression store for the compressed digital data set and repeating the decompression process;
otherwise, providing an output from the decompression store.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Definitions

Figure 1:
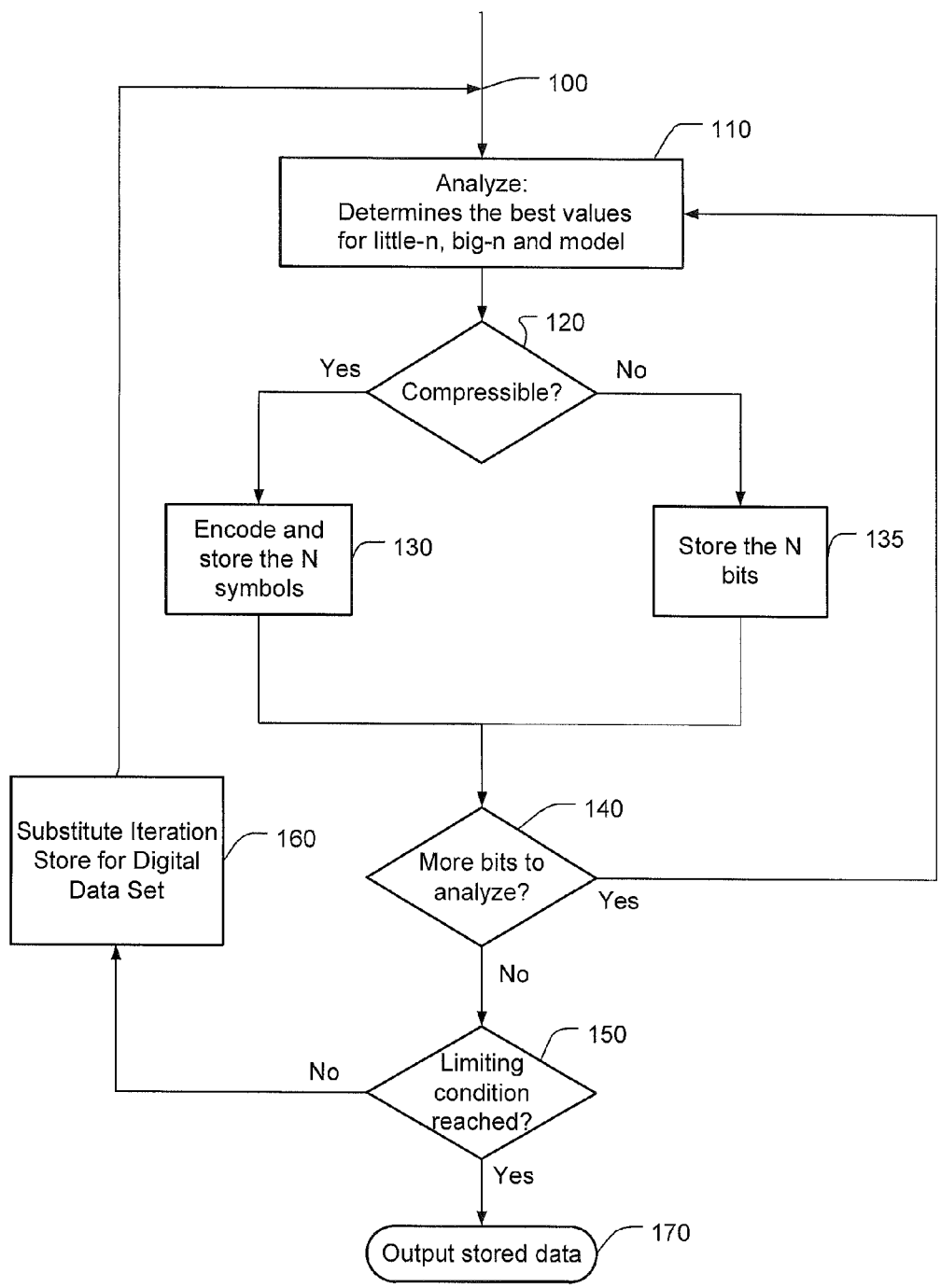
FIG. 1 is a flow chart showing an exemplary embodiment of logical processes used in compressing a digital data set in accordance with the present invention.

As used in this description and the accompanying claims, the following terms shall have the meanings indicated, unless the context otherwise requires:

The term "entropy" as applied to a partition of a data set means the number of bits required to encode the partition.

The term "n" or "little-n" means the number of bits in a symbol.

The term "N" or "big-n" refers to the number of symbols of length little-n to be encoded or copied.

A "model" is a probability model and/or an encoding scheme used by an encoder. There may be one or more models that can possibly be used for any partition, but only one model will be selected for use in encoding a given partition.

A "computer" is a device that processes digital data in software executed in an environment including a processing unit and memory or in hardware such as field-programmable gate arrays.

A "FIFO" is a logical device achieving flow of data from one process to another process and having the characteristic that data exits the device in the exact same order the order in which it enters the device. A FIFO has the additional characteristic that if no data currently is available, a retrieving process is made to wait until additional data is available or until the device is notified that no additional data will be presented (commonly referred to as an "End of File" condition). A FIFO may be implemented as a queue, a linked list, a memory buffer, an inter-process communication or any other mechanism that achieves the specified behavior.

A "digital data set" is a sequence of bits that represent the data that is to be compressed. A digital data set also has a length attribute that indicates the number of bits of actual data represented.

A "symbol" is a sequence of bits of a fixed size used in encoding.

A "compression score" is a calculated estimate of how well a defined partition of the digital data set can be compressed. Factors that influence the compression score may include such things as a theoretical compression ratio for the partition and a theoretical number of bits saved by compressing the partition.

A "field" is a series of one or more bits used to hold information.

A "sentinel" is a field used to hold an endpoint indicator.

A "partition" is a portion of a compressed digital data set containing a header followed by a sequence of bits that represent either compressed or uncompressed data.

A "computer process" is the performance of a described function in a computer using computer hardware (such as a processor, field-programmable gate array or other electronic combinatorial logic, or similar device), which may be operating under control of software or firmware or a combination of any of these or operating outside control of any of the foregoing. All or part of the described function may be performed by active or passive electronic components, such as transistors or resistors. In using the term "computer process" we do not necessarily require a schedulable entity, or operation of a computer program or a part thereof, although, in some embodiments, a computer process may be implemented by such a schedulable entity, or operation of a computer program or a part thereof. Furthermore, unless the context otherwise requires, a "process" may be implemented using more than one processor or more than one (single- or multiprocessor) computer.

FIG. 1 is a flow chart showing an exemplary embodiment of logical processes used in compressing a digital data set in accordance with the present invention. The process begins at point 100 with an input digital data set. The digital data set is then processed by Analyzer 110, which processes at least part of the digital data set and returns optimal values for the symbol length (little-n), the partition size (big-n) and a probability model. If the Analyzer determines that compression is not possible, it also indicates this fact and returns the number of bits that should be copied from the digital data set.

Once the Analyzer returns it results, a determination is made at decision block 120 as to whether or not the partition contains compressible data. If the partition contains compressible data, Encoder 130 encodes N symbols of symbol length n using the model selected by Analyzer 110 and stores the results in an Iteration Store. If the partition contains non-compressible data, then process 135 stores N bits of data from the partition into the Iteration Store.

At decision block 140, a determination is made as to whether or not all data from the digital data set has been processed.

If all data has not been processed, then the flow goes back to Analyzer 110 to continue processing the remainder of the digital data set.

If all data has been processed, then decision block 150 determines whether a limiting condition has been reached. For example, a limiting condition may be established as the achievement of a desired amount of compression expressed as a percentage of the original file size. Another limiting condition may be established as when the difference in compression achieved on two successive passes is less than a specified percentage of the file size. Alternatively, the limiting condition may be expressed as a combination of these endpoints.

If the limiting condition has not been reached, then process 160 substitutes the contents of the Iteration Store for the digital data set and the entire process is repeated starting at point 100.

If the limiting condition has been reached, then the contents of the Iteration Store are returned as the compressed digital dataset.

Figure 2:
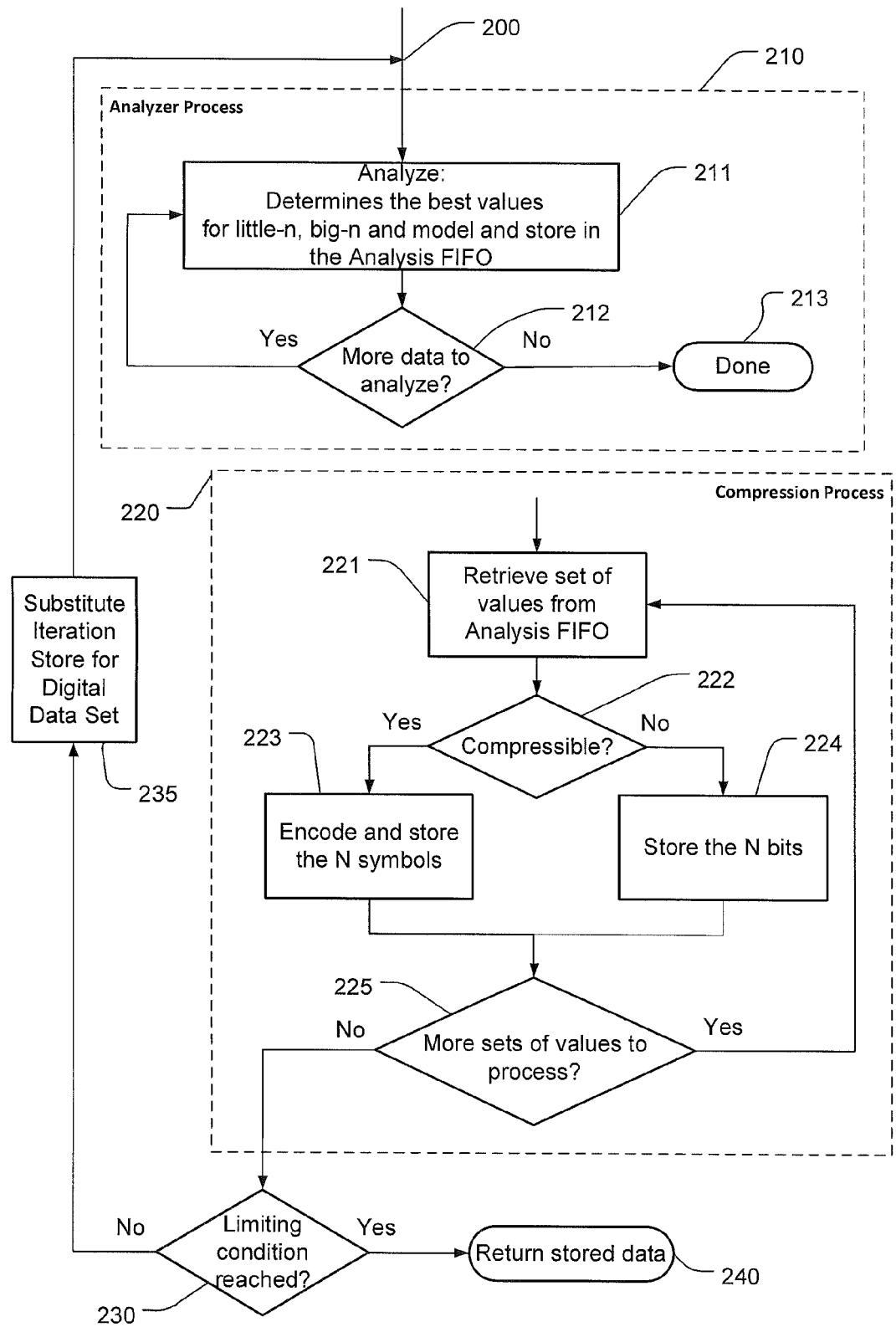
FIG. 2 is a flow chart showing an exemplary embodiment of logical processes, similar to those in FIG. 1, used in compressing a digital data set, but where the Analysis and Compression processes are performed in parallel in accordance with the present invention.

FIG. 2 is a flow chart showing an exemplary embodiment of logical processes, similar to those in FIG. 1, used in compressing a digital data set, but where the Analysis and Compression processes are performed in parallel in accordance with the present invention. This process begins at point 200 with an input digital data set. Said dataset is presented to Analyzer Process 210, which processes at least part of the digital dataset at Analyzer 211, and if compression is possible, places optimal values for the symbol length (little-n), the partition size (big-n) and a probability model into an Analysis FIFO. If the Analyzer determines that compression is not possible, it stores an indicator and the number of bits that should be copied from the digital data set into the Analysis FIFO.

At decision block 212 a determination is made whether all the data from the digital data set has been processed. If all the data has not been processed, then the flow goes back to Analyzer 211 to process the reminder of the data. If all the data has been processed, then Analyzer Process terminates.

Compression Process 220 operates in parallel with the Analyzer Process 210. A set of values are retrieved from the Analysis FIFO at step 221. Each set represents values for little-n, big-n and model if there is compressible data, or an indicator and a length if there is non-compressible data. If the decision block 222 determines that there is compressible data, then Encoder 223 encodes N symbols of symbol length n using the specified mode and stores the results in the Iteration Store. If the data is not compressible, then process 224 stores N bits from the digital data set into the Iteration Store with no additional processing.

Decision block 225 determines whether it has processed all data from the digital data set.

If not, then the flow returns to step 221 to retrieve additional values from the Analyzer FIFO.

If all the data has been processed, then decision block 230 determines whether a limiting condition has been reached.

If the limiting condition has not been reached, then process 235 substitutes the contents of the Iteration Store for the digital data set and the flow returns to point 200.

If the limiting condition has been reached, then step 240 returns the contents of the Iteration Store as the compressed digital dataset.

Figure 3:
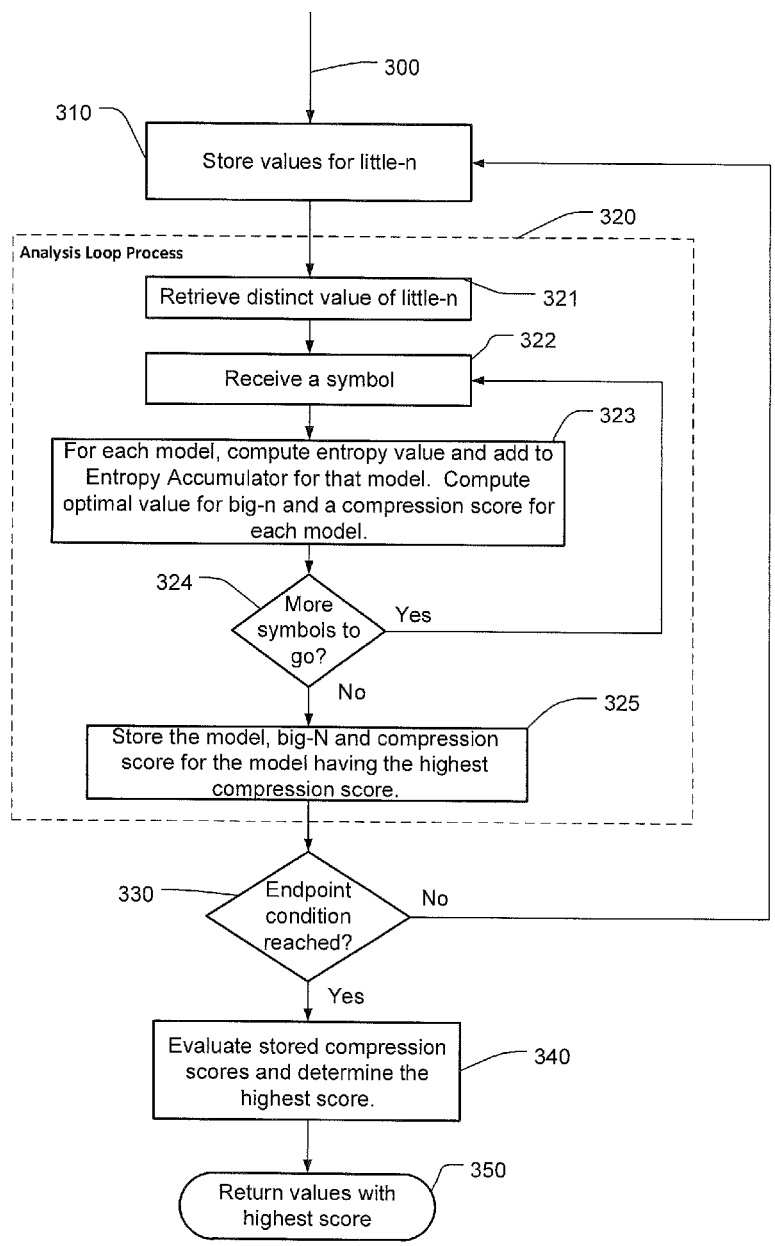
FIG. 3 is a flow chart showing an exemplary embodiment of logical processes that can be used to analyze at least a portion of a digital data set in the Analysis processes of FIG. 1 (110) or FIG. 2 (211) in accordance with the present invention.

FIG. 3 is a flow chart showing an exemplary embodiment of logical processes that can be used to analyze at least a portion of a digital data set in the Analysis process of FIG. 1 (item 110) or FIG. 2 (item 211) in accordance with the present invention, This process begins at point 300 where it is presented with at least a portion of a digital data set. Step 310 stores a set of values for little-n selected from a set of natural numbers having a value greater than 0. The process then continues by executing Analysis loop process 320. The Analysis loop process 320 retrieves a distinct value for little-n at step 321. Using this value, a symbol of length little-n is received from the digital data set at step 322. Step 323 computes an entropy value for the received symbol for each model in a set of models and adds the computed entropy value to an Entropy Accumulator for that model and then uses the updated values to compute the optimal partition size (big-n) and a compression score for each model. Decision block 324 determines whether more symbols are available for processing and if so, control passes back to step 322. Otherwise, step 325 stores the model and values of big-N and compression score for the model with the highest compression score. The computations in step 325 reflect values for the entire digital data set.

Decision block 330 determines if an endpoint condition has been reached. If it has not reached an endpoint condition, then control passes to step 310 to store another value for little-n and execute Analysis loop process 320. If it has reached an endpoint condition, the stored values from the Analysis loop process are evaluated at step 340 and the values with the highest compression score are returned at step 350.

Figure 4A:
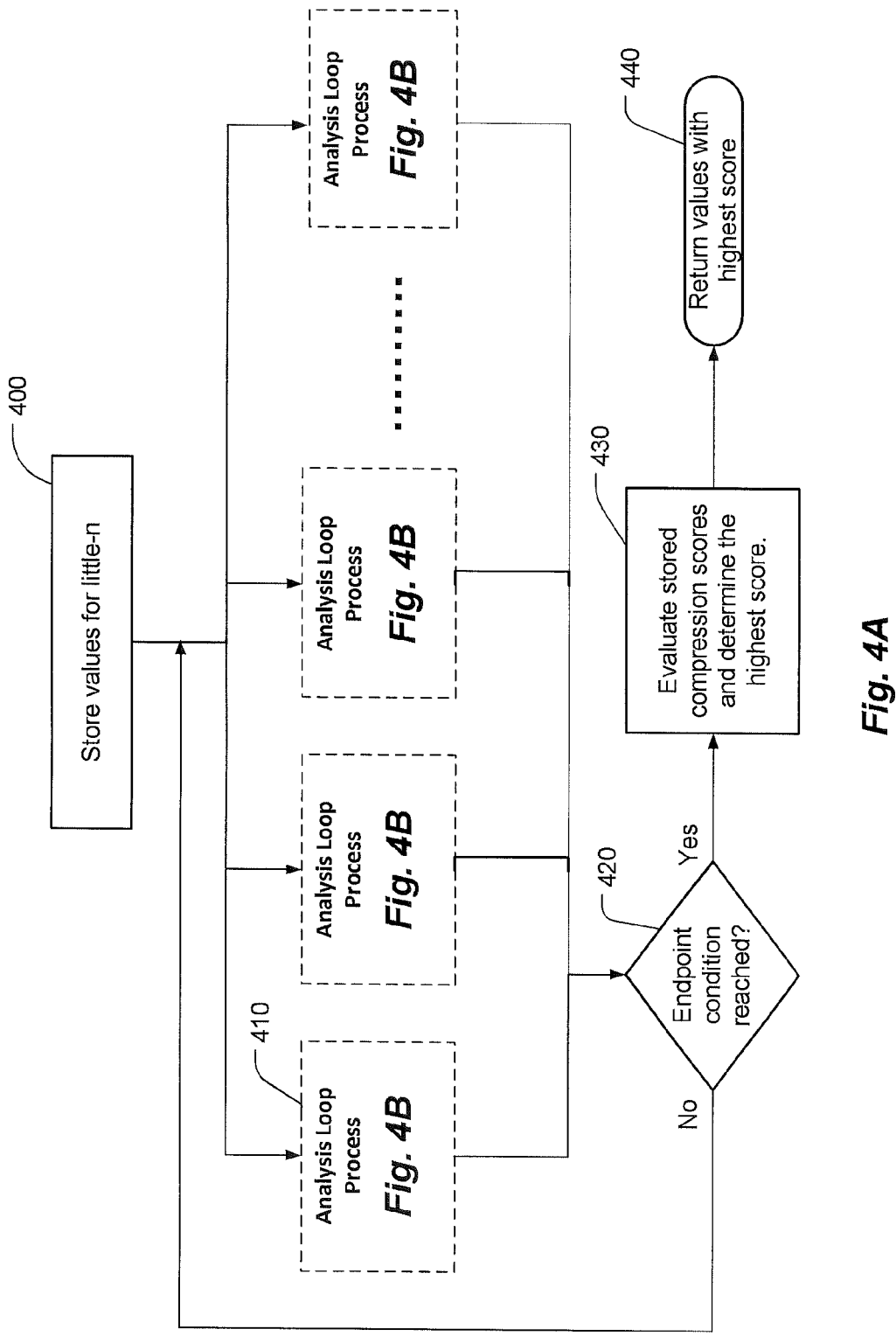
FIG. 4A is a flow chart showing an exemplary embodiment of logical processes, similar to those of FIG. 3, but wherein the Analysis loop is performed in parallel, so that the logical processes here can be used to analyze at least a portion of a digital data set in the Analysis processes of FIG. 1 (110) or FIG. 2 (211) in accordance with the present invention.

FIG. 4A is flow chart showing an exemplary embodiment of logical processes, similar to those of FIG. 3, but wherein the Analysis loop process is performed in parallel, so that the logical processes here can be used to analyze at least a portion of a digital data set in the Analysis processes of FIG. 1 (item 110) or FIG. 2 (item 211) in accordance with the present invention.

The process starts at step 400 where all the possible values for little-n selected from a set of natural numbers greater than zero are placed in a FIFO and made available to one or more Analysis loop processes 410 running as parallel processes. Each Analysis Loop 410 retrieves a value of little-n from the FIFO and uses that value to determine values for partition size (big-n), model and compression score that yield optimum compression for symbol size little-n and stores them for later processing.

Decision block 420 determines whether an endpoint condition has been reached. If it has not reached an endpoint condition, the Analysis loop processes continue to process. If it has reached an endpoint condition, then the stored values from the Analysis loop processes are evaluated at step 430 and the values with the highest compression score are returned at step 440.

Figure 4B:
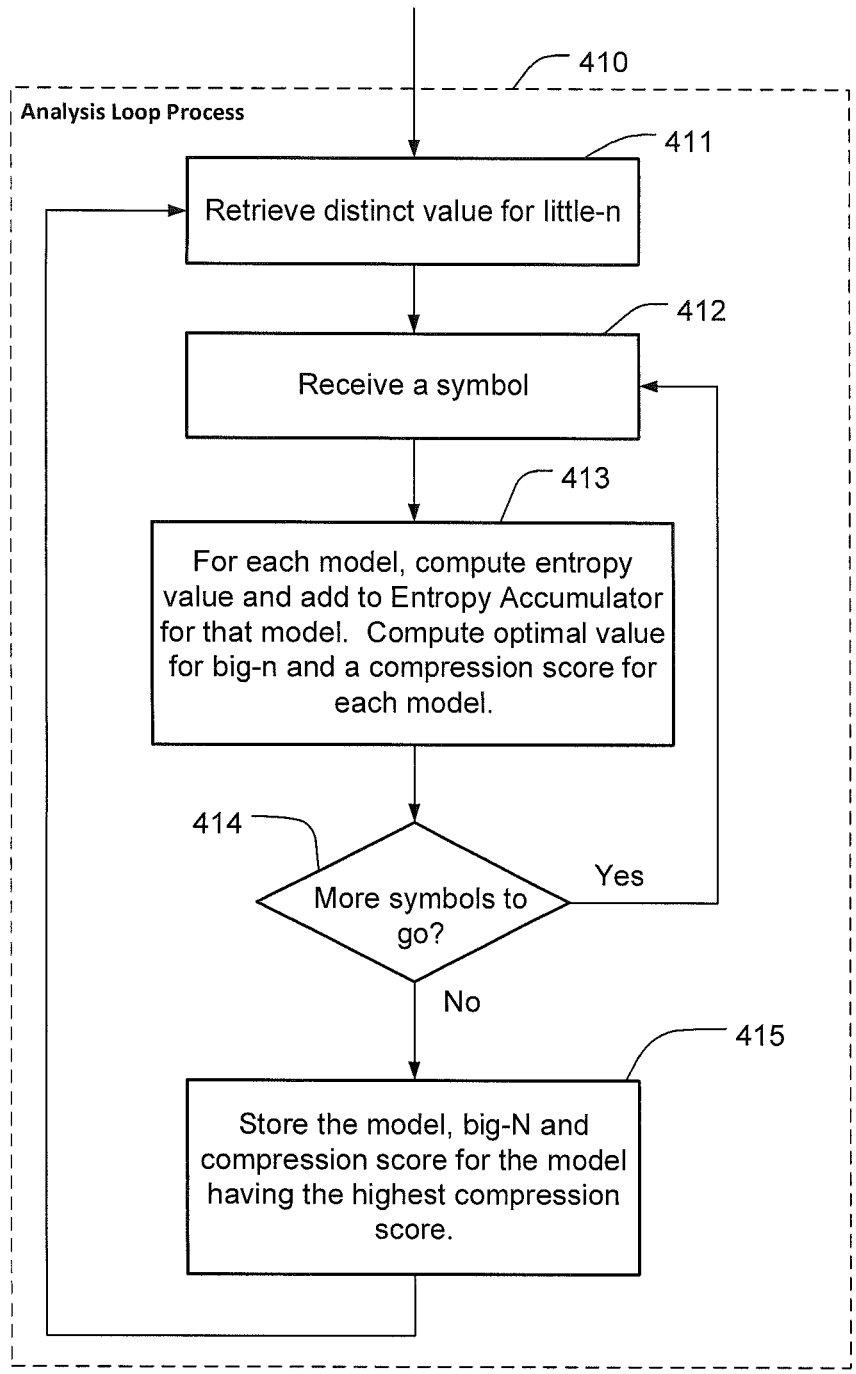
FIG. 4B is a flow chart showing an exemplary embodiment of logical processes used to implement each Analysis loop of FIG. 4A in accordance with the present invention.

FIG. 4B is a flow chart showing an exemplary embodiment of logical processes used to implement each Analysis loop process of FIG. 4A in accordance with the present invention.

The Analysis loop process 410 retrieves a value for little-n from a FIFO at step 411. Using this value, it then receives a symbol of length little-n from the digital data set at step 412. Step 413 computes an entropy value for the received symbol for each model in a set of models and adds the computed entropy value to an Entropy Accumulator for that model and then uses the updated values to compute the optimal partition size (big-n) and a compression score for each model. Decision block 414 determines whether more symbols are available for processing and if so, control passes back to step 412. Otherwise, step 415 stores the model and values of big-N and compression score for the model with the highest compression score.

Figure 5:
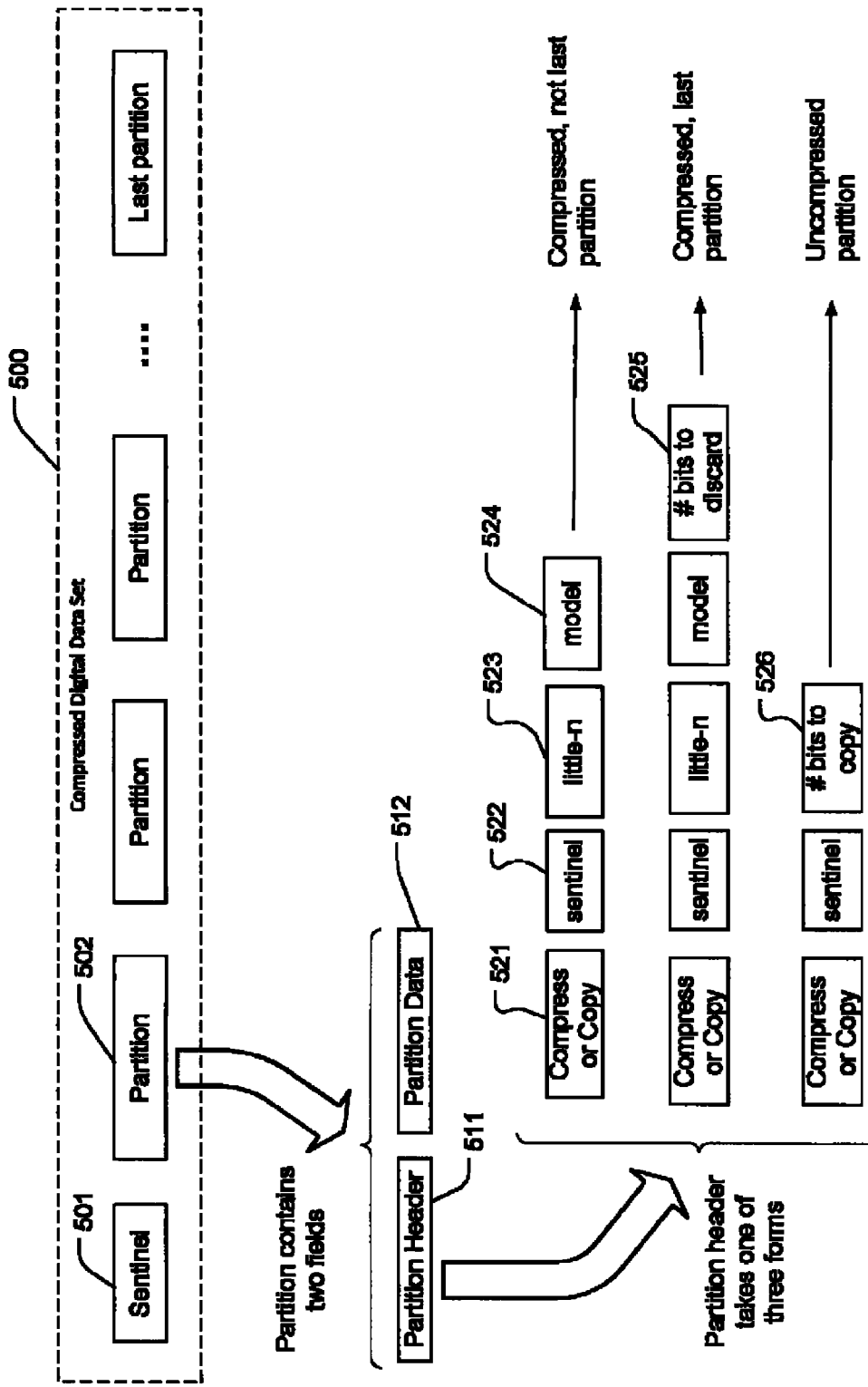
FIG. 5 is a diagram of the structure of a compressed digital data set stored in the iteration store, in accordance with an exemplary embodiment of the present invention, resulting from operation of any of the embodiments of FIG. 1 or FIG. 2.

FIG. 5 is a diagram of the structure of a compressed digital data set stored in the iteration store, in accordance with an exemplary embodiment of the present invention, resulting from operation of any of the embodiments of FIG. 1 or FIG. 2. The compressed digital data set 500 begins with a single bit referred to as the "sentinel" 501. This bit is set to "1" during the first compression iteration and to "0" on all subsequent iterations. A decompression system uses the sentinel to determine when it has reached the last iteration in the decompression process.

Following the sentinel are one or more "partitions" 502. Each partition contains a "partition header" 511 and "partition data" 512. The fields in a partition header can be placed in any desired order, and claims below specifying fields of the partition do not require any specific order. In one embodiment each partition header begins with two single bit fields. The first field 521 indicates whether the partition data is compressed data. The second field 522, namely the sentinel, indicates whether or not this is the last partition in the compressed digital data set.

For compressed data, there are two additional fields that hold the values of little-n 523 and model 524 that the decoder must use. In addition, if this is the last data partition, an additional field 525 is present that indicates the number of bits in the last decoded symbol must be discarded. This is necessary since the number of bits in the uncompressed partition might not have been evenly divisible by little-n and hence, additional bits were inserted to fill out the last symbol.

For partitions that contain uncompressed data, the header contains a field (526) indicating the total number of bits in the partition.

Since a "compressed digital data set" contains the contents of an Iteration Store, this also describes an exemplary embodiment of an Iteration Store.

Figure 6:
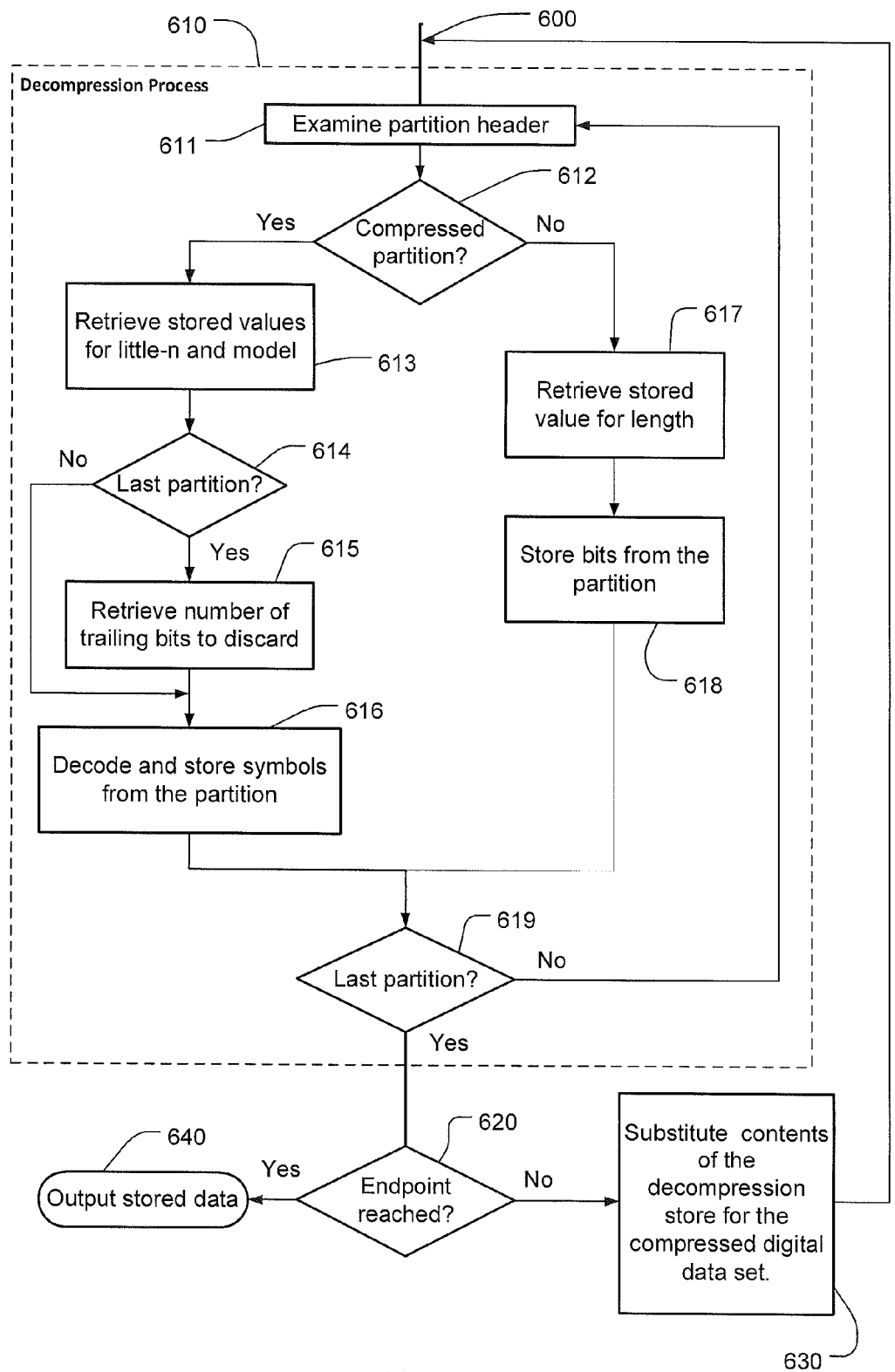
FIG. 6 is a flow chart showing an exemplary embodiment of logical processes used for decompressing a digital data set that has been compressed using the processes shown in FIG. 1 or FIG. 2, all in accordance with the present invention.

FIG. 6 is a flow chart showing an exemplary embodiment of logical processes used for decompressing a digital data set that has been compressed using the processes shown in FIG. 1 or FIG. 2, all in accordance with the present invention. This process starts at point 600 with a compressed digital data set. The decompression process 610 processes each partition in the compressed digital data set in sequence.

A partition header is examined at process 611. The decision block 612 determines if the partition contains compressed data and if it does, process 613 retrieves values for little-n and model from the header. Decision block 614 determines if this is the last partition and if so, process 615 retrieves the value for the number of trailing bits to discard. Then, the partition data is processed by decoder 616 using the retrieved values for little-n, model and trailing bits to discard and the resulting decoded symbols are stored in a decompression store.

If the partition contains uncompressed data, process 617 retrieves the value for length from the partition header. Process 618 then stores the partition data directly in the decompression store with no additional processing.

Decision block 619 determines if any more partitions require processing and if they do, processing continues at step 611.

After all partitions are processed, decision block 620 determines if an endpoint condition has been reached. If not, additional iterations are needed and process 630 substitutes the contents of the decompression store for the compressed digital data set and the decompression process continues at point 600. Otherwise, step 640 returns the contents of the decompression store as the digital data set. Analyzer loops can run in parallel. For example, various embodiments can be configured to so that little n can take on 32 different values and, therefore, there may be 32 simultaneous loops."

A proof of concept test was conducted using a compressed Linux archive file created using the "tar" utility and then compressed using the "gzip" compression utility. The resulting file had a size of 86,744,700 bytes. This file was then input to three different compression programs, "gzip", "zip" and the current invention. The sizes of the resulting compressed output files were recorded and then each output file was input into the utility that created it. For proof of concept testing, the methods described in this application in connection with FIGS. 1 and 3 were employed and the resulting output file conformed to FIG. 5. In this testing, an arithmetic encoder was used, and the compression models used were an order-0 adaptive model and an order-1 adaptive model. A total of three compression passes were performed for each compression utility.

Table 2 shows the results of this test. While each of the utilities achieved some compression after the first pass, only the current invention proof of concept embodiment was able to achieve additional compression in the second and third passes. The other utilities could only achieve "negative compression" in later passes, i.e., the output file was larger than the input file.

TABLE 2

|  | Original Size | After Pass 1 | After Pass 2 | After Pass 3 |
| --- | --- | --- | --- | --- |
| original file | 86744700 | | | |
| gzip | | 86694822 | 86708713 | 86722464 |
| zip | | 86694961 | 86695127 | 86695301 |
| proof of concept | | 86588563 | 86510641 | 86415482 |

The present invention may be embodied in many different forms, including, but in no way limited to, computer program logic for use with a processor (e.g., a microprocessor, microcontroller, digital signal processor, or general purpose computer), programmable logic for use with a programmable logic device (e.g., a Field Programmable Gate Array (FPGA) or other PLD), discrete components, integrated circuitry (e.g., an Application Specific Integrated Circuit (ASIC)), or any other means including any combination thereof.

Computer program logic implementing all or part of the functionality previously described herein may be embodied in various forms, including, but in no way limited to, a source code form, a computer executable form, and various intermediate forms (e.g., forms generated by an assembler, compiler, networker, or locator.) Source code may include a series of computer program instructions implemented in any of various programming languages (e.g., an object code, an assembly language, or a high-level language such as FORTRAN, C, C++, JAVA, or HTML) for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

The computer program may be fixed in any form (e.g., source code form, computer executable form, or an intermediate form) either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device. The computer program may be fixed in any form in a signal that is transmittable to a computer using any of various communication technologies, including, but in no way limited to, analog technologies, digital technologies, optical technologies, wireless technologies, networking technologies, and internetworking technologies. The computer program may be distributed in any form as a removable storage medium with accompanying printed or electronic documentation (e.g., shrink wrapped software or a magnetic tape), preloaded with a computer system (e.g., on system ROM or fixed disk), or distributed from a server or electronic bulletin board over the communication system (e.g., the Internet or World Wide Web.)

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL.)

While the invention has been particularly shown and described with reference to specific embodiments, it will be understood by those skilled in the art that various changes in form and detail may be made therein without departing from the spirit and scope of the invention as defined by the appended clauses. As will be apparent to those skilled in the art, techniques described above for panoramas may be applied to images that have been captured as non-panoramic images, and vice versa.

Embodiments of the present invention may be described, without limitation, by the following clauses. While these embodiments have been described in the clauses by process steps, an apparatus comprising a computer with associated display capable of executing the process steps in the clauses below is also included in the present invention. Likewise, a computer program product including computer executable instructions for executing the process steps in the clauses below and stored on a computer readable medium is included within the present invention.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A computer-implemented method of performing lossless compression of a digital data set, the method comprising:
    performing a compression process including:
        analyzing at least a part of the data set to establish a partition thereof into N symbols of symbol length n, and to determine whether the N symbols can be further compressed, and, if so, a model to be used in encoding the N symbols;
        if it has been determined that the N symbols can be further compressed, encoding the N symbols using the model and storing the encoded data in an iteration store;
        if it has been determined that the N symbols cannot be compressed, storing the N symbols in the iteration store;
    determining whether any part of the digital data set remains to be processed, and if so, then repeating the compression process for an additional part of the digital data set; and if not, then substituting the contents of the iteration store for the data set and repeating the compression process on the data set thus updated until a specified end condition has been met, and then providing an output from the iteration store.

2. A computer-implemented method of analyzing a digital data set to establish a partition thereof into N symbols of symbol length n, and to determine whether the N symbols can be further compressed, and, if so, a model to be used in encoding the N symbols, the method comprising:
    in a computer process, storing for later retrieval a set of values for a natural number n that is greater than 0;
    performing an analysis loop process including:
        retrieving a distinct one of the stored values for n,
        for each symbol of length n in the data set, performing an entropy calculation including:
            receiving such symbol from the digital data set at an input;
            for each model in a set of models,
                computing an entropy value and adding the computed entropy value to an entropy accumulator for such model; and
                using the value in the entropy accumulator, computing, for such symbol, a compression score and an updated value of partition size N for such model;
        using the values in the entropy accumulators for each of the models, identifying the model having the best compression score; and storing the identified model, its corresponding value of N, and its compression score;
    determining whether a processing end point has been reached, and if not, then
    repeating the analysis loop process for an additional value of n; otherwise
    evaluating the stored compression scores for each value of n to identify the value of n having the best compression score; and returning the identified value of n, and its corresponding model and its corresponding value of N.

3. A method according to claim 2, wherein the processing end point is completion of processing for all values of n.

4. A method according to claim 2, wherein the processing end point is when the compression score for at least one value of n and using at least one model is deemed sufficient.

5. A method according to claim 2, wherein performing the analysis loop process includes performing a first analysis loop process for a first distinct value for n in parallel with performing a second analysis process for a second distinct value for n.

6. A method according to claim 2, wherein storing the set of values for n includes storing the values in a FIFO and retrieving a distinct one of the stored values for n includes retrieving it from the FIFO.

7. A method according to claim 5, wherein the processing end point is completion of processing for all values of n.

8. A method according to claim 5, wherein the processing end point is when the compression score for at least one value of n and using at least one model is deemed sufficient.

9. A computer-implemented method of performing lossless compression of a digital data set, the method comprising:
    performing an analysis process including:
        analyzing at least a part of the data set to establish a partition thereof into N symbols of symbol length n, and to determine whether the N symbols can be further compressed, and, if so, a model to be used in encoding the N symbols;
        storing, in an analysis FIFO, a set of values of n, N, and the model for the just-analyzed portion of the digital data set;
    determining whether any part of the digital data set remains to be processed, and if so, then repeating the analysis process for an additional part of the digital data set;
    for each set of values in the analysis FIFIO, performing an encoding process including:
        retrieving, from the analysis FIFO, such set of values of n, N, and the model;
        if it has been determined that the N symbols can be further compressed, encoding the N symbols using the retrieved model and retrieved value of n and storing the compressed data in an iteration store;
        if it has been determined that the N symbols cannot be compressed, storing the N symbols in the iteration store;
    substituting the contents of the iteration store for the data set and repeating the analysis process and the compression process on the data set thus updated until a specified end condition has been met, and then providing an output from the iteration store.

10. A method according to claim 9, wherein the analyzing process and the compression process operate in parallel at least some of the time.

11. A computer-implemented method of performing lossless compression of a digital data set according to claim 1 and thereafter decompressing the resulting compressed digital data set, the method further comprising:
performing a decompression process including:
for each partition in the compressed digital data set,
examining a partition header for the partition to determine if its data is compressed or uncompressed and if the partition is the last partition;
if the partition's data is determined to be compressed,
retrieving from the partition header a value of little-n for the partition and a value identifying the model;
if the partition is determined to be the last partition, retrieving from the header a number of bits in the last decompressed symbol from the partition that must be discarded;
decoding the partition data using the model identified for the partition and the value of little-n for the partition and storing the decoded partition data in a decompression store;
if the partition's data is determined to be uncompressed,
retrieving from the partition header a value indicating the number of bits of uncompressed data in the partition;
using the value indicating the number of bits of uncompressed data in the partition, copying the partition's data to the decompression store;
if an endpoint condition has not been reached, then substituting the contents of the decompression store for the compressed digital data set and repeating the decompression process;
otherwise, providing an output from the decompression store.

12. A non-volatile storage medium in which is stored a compressed digital data set, the compressed data set comprising:
a sentinel indicating whether or not the results of decompressing said compressed digital data set results in an endpoint condition;
a set of partitions, wherein at least one of the partitions includes compressed digital data, and each partition includes:
a partition header, the header including:
a type field indicating whether the partition contains compressed or uncompressed data;
a sentinel indicating whether the partition is the last partition in the compressed digital data set;
if the type field indicates that the partition contains uncompressed data, a length field indicating the number of bits of uncompressed data in the partition;
if the type field indicates that the partition contains compressed data, a symbol field containing a value of little-n in the partition, a model field containing a value identifying the model used in the partition, and if the last partition, a discard field indicating a number of bits in the last decompressed symbol from the partition that must be discarded; and
data of the partition, such data having content and format characterized by the partition header.

* * * * *